United States Patent
Biagini et al.

(10) Patent No.: US 8,035,964 B2
(45) Date of Patent: Oct. 11, 2011

(54) MULTI-POSITION HOUSING MADE OF METAL EXTRUDED SECTION MEMBER FOR MANUFACTURING A WATERPROOF POWER ELECTRONIC DEVICE

(75) Inventors: Eric Biagini, Saint Hilaire de Beauvoir (FR); Yves Caussin, Assas (FR)

(73) Assignee: Intelligent Electronic Systems, Montpellier (FR)

( * ) Notice: Subject to any disclaimer, the term of this patent is extended or adjusted under 35 U.S.C. 154(b) by 158 days.

(21) Appl. No.: 12/352,807

(22) Filed: Jan. 13, 2009

(65) Prior Publication Data

US 2009/0180251 A1    Jul. 16, 2009

(30) Foreign Application Priority Data

Jan. 16, 2008   (FR) .................................... 08 50255

(51) Int. Cl.
*H05K 7/20* (2006.01)
*F28F 7/00* (2006.01)

(52) U.S. Cl. ....... 361/690; 165/80.2; 165/185; 361/703; 361/704; 361/715

(58) Field of Classification Search .................. 361/690, 361/715
See application file for complete search history.

(56) References Cited

U.S. PATENT DOCUMENTS

| | | | | |
|---|---|---|---|---|
| 3,219,885 | A * | 11/1965 | Schniers | 361/710 |
| 3,961,666 | A * | 6/1976 | Suzuki et al. | 165/129 |
| 4,656,559 | A * | 4/1987 | Fathi | 361/721 |
| 4,791,531 | A * | 12/1988 | Jessup | 361/736 |
| 5,742,478 | A * | 4/1998 | Wu | 361/704 |
| 6,144,556 | A * | 11/2000 | Lanclos | 361/695 |
| 6,411,514 | B1 * | 6/2002 | Hussaini | 361/704 |
| D509,806 | S * | 9/2005 | Lee et al. | D13/179 |
| 7,359,203 | B2 * | 4/2008 | Chen | 361/714 |
| 2006/0152904 | A1 * | 7/2006 | Chuang | 361/703 |
| 2007/0025087 | A1 | 2/2007 | Chen | |
| 2007/0086164 | A1 * | 4/2007 | Hernandez et al. | 361/703 |
| 2010/0039771 | A1 * | 2/2010 | Marchand | 361/694 |

FOREIGN PATENT DOCUMENTS

| | | |
|---|---|---|
| DE | 79 11 538 A | 8/1979 |
| EP | 1 841 302 A | 10/2007 |
| WO | 2007/041738 A | 4/2007 |

* cited by examiner

*Primary Examiner* — Gregory Thompson
(74) *Attorney, Agent, or Firm* — Lucas & Mercanti, LLP

(57) ABSTRACT

The extruded section forms a tunnel that is substantially rectangular and is provided with fins on at least one side of the rectangle. The fins allow air to flow outside the housing by natural convection in the extrusion direction. A side without fins serves as a base for fastening the housing and as a support for power electronic components of the power electronic device. The fins are machined transversely to the extrusion direction to form notches in the fins. The notches being aligned in succession to allow air to flow outside the housing by natural convection in the optimum direction.

17 Claims, 6 Drawing Sheets

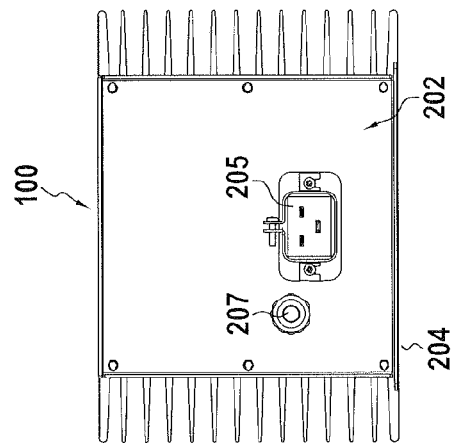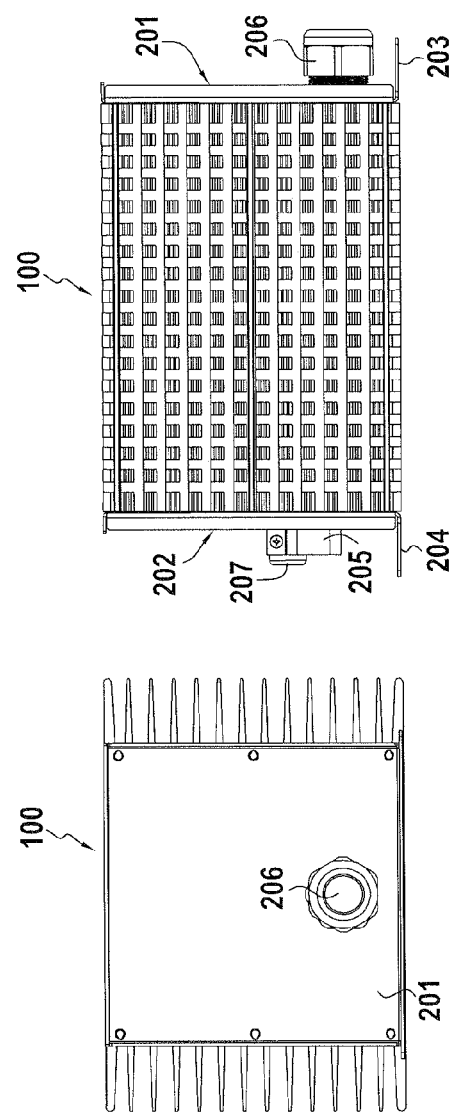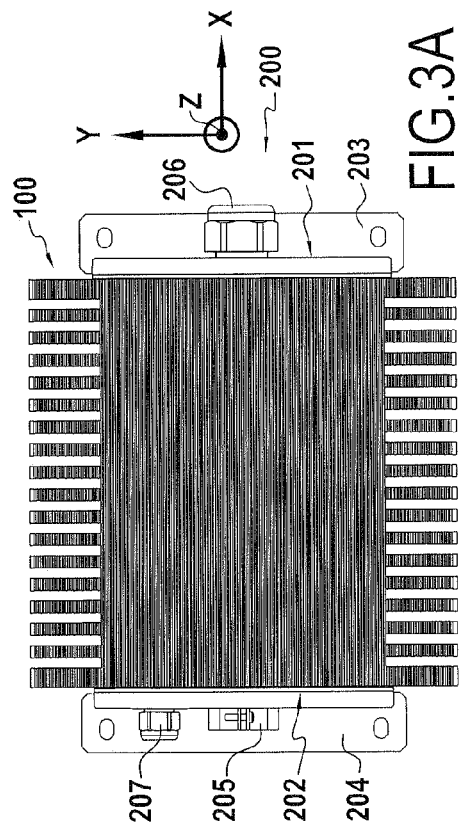
FIG.3D
FIG.3A
FIG.3B
FIG.3C

MULTI-POSITION HOUSING MADE OF METAL EXTRUDED SECTION MEMBER FOR MANUFACTURING A WATERPROOF POWER ELECTRONIC DEVICE

This application claims the priority of FR 08 50255 filed Jan. 16, 2008, the priority of which is hereby claimed and the application incorporated by reference herein.

BACKGROUND OF THE INVENTION

The present invention relates to the general field of housings made of metal extruded section members and designed for manufacturing waterproof power electronic devices.

Such waterproof power devices are, for example, battery chargers designed to be installed on board vehicles such as, for example, fork-lift trucks, golf carts, etc. that can be cleaned using methods that are relatively intrusive, such as, for example, methods using high-pressure fluid. In such applications, it is necessary for the battery charger to be fully waterproof in order to protect the electronic components that it contains.

In the particular context described above, it is naturally out of the question to use conventional ventilation with a fan blowing air into the housing. The action of the fan requires an opening to be provided, and fluid or solid particles can enter the housing through the opening, which is unacceptable for this type of power electronic device.

More particularly, the invention relates to such a housing whose extruded section member forms a tunnel that is of substantially rectangular closed section and that is provided with fins on at least one side of the rectangle. By increasing the heat exchange area via which the housing can exchange heat with the outside air, the fins make it possible to dissipate heat. The heat dissipation is increased when a flow of air is blown in contact with the fins. However, in the particular context described above, it is also out of the question to position a fan for blowing air over the fins of the housing. That is because fan technology does not make it possible to implement such a fan with satisfactory and relatable waterproofness at a reasonable cost.

Generally, a side that is not provided with fins serves as a base for fastening the housing and as a support for supporting the power electronic components of the power electronic device.

The housing can then exchange heat to a marginal extent with the support to which it is fastened. However, the nature of said support is totally unknown a priori. Its material, its thickness, or its surface can have very varied thermal characteristics allowing heat to be removed or preventing heat from being removed.

Thus, since the housing is closed and cannot be ventilated externally, it must therefore exchange the heat it generates with the surrounding air solely via radiation and natural convection, i.e. without artificial ventilation.

Even more precisely, the fins of the extruded section member forming the housing are thus adapted to the situation in which air flows by natural convection in the extrusion direction outside the housing.

Therefore, it is necessary to make provision for natural convection and for radiation to be maximized in order to guarantee that sufficient heat is removed to enable the power electronic device placed inside the housing to operate properly.

In addition, it is known that power electronic devices are generally mass-produced and are subject to very tight cost constraints.

As regards satisfying cost constraints and procuring waterproofness, it is known that the use of a one-piece element extruded to form a tunnel is particularly advantageous because it guarantees waterproofness on all four sides of the housing. This also facilitates mounting the battery charger or, more generally, mounting a power device, and thus contributes to reducing the final cost of the power electronic device.

For a heat dissipater or "heatsink", extruding an aluminum tunnel requires the fins to be in the extrusion direction. Therefore, currently existing housings made of extruded section members are provided with fins in the extrusion direction, and they thus enable the heat generated inside the housing by the power electronic device to be removed via the fins, provided that said fins are positioned in such a manner as to be vertical.

It is also known that thermal performance improves not only with increasing surface area in contact with the air, hence the advantageousness of fins, but also with increasing speed of air over said surface area. The air heating on coming into contact with the fins generates a natural upward movement of air, which movement is facilitated if the air can rise freely, and thus if the fins extend vertically.

Mounting the housing on a vertical wall with the fins also extending vertically thus procures optimum dissipation for an extruded housing. This requires the power device to be installed in the same way in all vehicles in which the power electronic device is to be installed.

Currently, this is a constraint that is holding back the development of the use of power devices implemented using extruded housings. A very wide variety of contexts are thus currently deprived of this solution.

Unfortunately, if the device is mounted on a horizontal plane, the plane of the fins is then also horizontal, and the convection of air is much weaker. In spite of the existence of radiation, a very significant reduction in effectiveness (a reduction by more than 30%) is observed.

Therefore, assembled solutions exist in which radiators carrying fins are assembled on a pre-extruded tunnel that is not provided with fins. That makes it possible for the direction of the fins to be perpendicular to the extrusion direction or for the direction of the fins to form an angle with said extrusion direction. The radiators used have standard comb-shaped section members that generally have long fins mounted on thick bases and that are designed for forced convection. Forced convection requires a higher density for the heat flow and thus greater thickness for the base of the fins. Such solutions generally lead to housings having a very large mass of aluminum or of metal, which is penalizing. In addition, such solutions are complex to manufacture in terms of machining and of assembly, because the waterproofness constraint is still present.

OBJECT AND SUMMARY OF THE PRESENT INVENTION

A main object of the present invention is to mitigate the drawbacks encountered with housings that are known from the prior art, and also to satisfy the requirements of the production constraints that are known for this type of housing by providing a housing as defined above and on which the fins are machined transversely to the extrusion direction so as to form notches in the fins, said notches being aligned in succession in an "optimum" direction that forms an angle with the extrusion direction that is optimized as a function of a predetermined preferred installation direction for installing the housing, and said notches being of geometrical shape such that they allow air to flow outside the housing by natural convection in the optimum direction.

With such a housing, it is possible to make a power electronic device that can be installed in a plurality of positions while also guaranteeing that natural air convection dissipates the heat in satisfactory manner.

Manufacturing the housing by extruding the tunnel makes it is possible to provide the tunnel with fins in the extrusion direction. When they are installed vertically, said fins make it possible for the heating of the air coming into contact with them to generate a natural upward movement of the air facilitated by the vertical position of the fins.

When the power electronic device is placed along an installation direction other than the vertical direction, the fins also find themselves in said other direction. By means of the invention, the openings constituted by the notches that are preferably aligned in the vertical direction when the housing is placed in the preferred installation direction makes it possible to maintain natural convection for the air.

In accordance with the invention, the direction in which the notches are aligned on the housing, which direction is referred to as the "optimum direction", is thus chosen as a function of the preferred installation direction of the housing, which preferred installation direction is determined while the electronic device is being designed. The optimum direction is then ideally vertical when the housing is placed along the determined installation direction. With the invention, it is thus possible to allow the housing to be installed in at least two preferred installation directions. In practice, the housing can be installed in installation directions on either side of the preferred installation direction, with heat removal by means of the notches being quite satisfactory. The notches are then slightly inclined relative to the vertical but they nevertheless procure satisfactory convection. In practice, the invention thus allows the housing to be installed in more than two directions.

The housing of the invention is formed from a limited quantity of material, thereby making it possible to reduce costs, handling, transport, and associated energy consumption. The extruded tunnel structure makes a housing of the invention very simple to manufacture in combination with the use of simple machining operations followed by simple assembly operations on the various component parts.

Advantageously, at least two opposite sides of the rectangle are provided with fins that are machined transversely so as to form notches that are aligned in succession in optimum directions that are identical on both of the sides provided with fins.

This characteristic guarantees that heat is removed in satisfactory manner on two opposite sides of the structure of rectangular section that forms the housing.

According to an original characteristic of the invention, at least two opposite sides of the rectangle are provided with fins that are machined transversely so as to form notches aligned in succession in optimum directions that are different on each of the two sides provided with fins.

Providing two opposite sides with fins in which notches are machined in two different directions does not make it possible to maximize heat removal for a given installation direction but it does, however, offer greater freedom for the directional placement of the housing of the invention, it being possible for the majority of the heat removal to take place on one side for certain installation directions, and on the other side for other installation directions.

According to an advantageous characteristic, the optimum direction(s) form(s) an angle lying in the range 45° to 90° in absolute terms with the extrusion direction.

This corresponds to the installation directions that are generally observed. At less than 45°, heat removal takes place by natural air convection along the fins.

In a preferred embodiment, the notches are aligned in a direction that is perpendicular to the extrusion direction.

This makes numerous installation angles possible for the housing. If the housing having perpendicular notches is installed at an angle in the range 0° to 45°, the fins are active and they remove heat effectively. Above that range, the invention allows natural convection to take place through the notches, with this convection being maximized when the housing is installed in a horizontal installation direction, in which the fins are also horizontal but the notches are aligned in the vertical direction.

Therefore this characteristic provides best heat removal when the housing is installed vertically or horizontally, but it also provides satisfactory heat removal in the intermediate installation directions.

In advantageous embodiments of the invention, notches are formed at regular intervals lying in the range 4 millimeters (mm) to 10 mm.

Such a characteristic guarantees that air can flow by natural convection through said notches.

In advantageous embodiments of the invention, the notches present identical widths lying in the range 4 mm to 10 mm.

This characteristic guarantees that the notches do not offer too much resistance to the air flowing by natural convection and also guarantees that the contact surface area over which the fins are in contact with the air is large enough to guarantee that heat is removed satisfactorily when the housing is in the vertical position.

According to a particular characteristic of the invention, the distances between the notches are substantially equal to the widths of the notches.

In practice, this characteristic makes it possible to optimize both the air flow by natural convection and also the exchange surface area available for heat transfer.

Advantageously, the fins are spaced apart by a distance lying in the range 6 mm to 16 mm.

Such a distance between the fins corresponds to air flow by natural convection.

In practice, the widths of and the distances between the notches and the fins are involved in defining a maximum angle for the installation direction. The width of a vertical free passage for air between the notches varies as a function of the extent to which the preferred installation direction coincides with the real installation direction. The housing of the invention is preferably implemented while seeking to achieve an optimum between the amount of aluminum removed and the amount of aluminum kept for heat exchange, and to achieve an optimum between the machining angle and the range of possible installation directions.

Therefore, the machining angle and the machining characteristics, such as the width of the notches and the spacing between notches, are advantageously determined so as to obtain an optimum as a function of the envisaged installation direction, of the range of possible installation directions, and of the quantity of heat to be removed.

According to a particular characteristic of the invention, the extruded section member is such that the side(s) provided with fins is/are of thickness that tapers going from the base for fastening the housing and for supporting the electronic components towards the side of the rectangle that is opposite from said base.

Such a characteristic makes it possible to procure optimum removal of the heat that passes from the electronic components directly to the fastening base of the housing. The initially large and then tapering thickness that is present under the fins makes it possible to procure improved heat conduction as close as possible to the heat source. These conduction properties then decrease going away from the fastening base that constitutes the heat source.

The large width of the sides provided with fins at the fastening and support base makes it possible to procure increased thermal conduction at said base, where it is most useful. This characteristic thus makes it possible to optimize the profile of the housing with a view to obtaining optimum removal of the heat generated at the fastening and support base.

Advantageously, the side serving as a base for fastening the housing and as a support for the electronic components has a thickness that is greater than the thickness of the side opposite from the base.

Here too, the idea is to facilitate conduction of heat where said heat is most present, namely where the electronic components are placed. Thus, the conduction phenomenon is optimized while also not adversely affecting the total weight of the housing.

According to an advantageous characteristic of the invention, the extruded section member is such that, on at least one of the sides of the rectangle, the inside wall is provided with micro-striations or with micro-fins.

This characteristic makes it possible to procure a further increase in the area of heat exchange with the outside air. This characteristic, which brings a significant increase in heat dissipation, can be implemented as a function of the extrusion constraints.

According to an advantageous characteristic, the housing is treated by anodization.

This characteristic, which makes it possible to blacken the housing, increases the radiation therefrom, enabling the housing to offer increased heat removal.

Finally, the invention provides a multi-position power electronic device comprising at least one electronic module for performing the functions of a power electronic module mounted on at least one electronic card placed inside a housing of the invention, said housing being closed in waterproof manner by two side cheek plates fastened hermetically to the housing made of extruded section member. These cheek plates also make it possible to implement the inputs and outputs necessary for the device to operate.

In an advantageous application, the device is a battery charger, and at least one electronic module is suitable for implementing battery charging functions.

Advantageously, the power electronic device further includes an internal air flow system.

By combining an extruded-section-member housing of the invention with an internal air flow system, it is possible to optimize the use of the heat dissipation offered by the fins formed on the housing. The internal air flow system is then used to put the internal air into contact with the walls of the housing. Convective phenomena take place, thereby facilitating absorption of the heat by the walls of the housing.

Advantageously, the electronic card is carried by a metal support designed to be put into contact with at least one wall of the housing.

BRIEF DESCRIPTION OF THE DRAWINGS

Other characteristics and advantages of the present invention appear from the following description, given with reference to the accompanying drawings which show an embodiment of the invention that is in no way limiting. In the drawings:

FIGS. 3A to 3D show an on-board charger of the invention;

DETAILED DESCRIPTION OF AN EMBODIMENT

Figure 1:
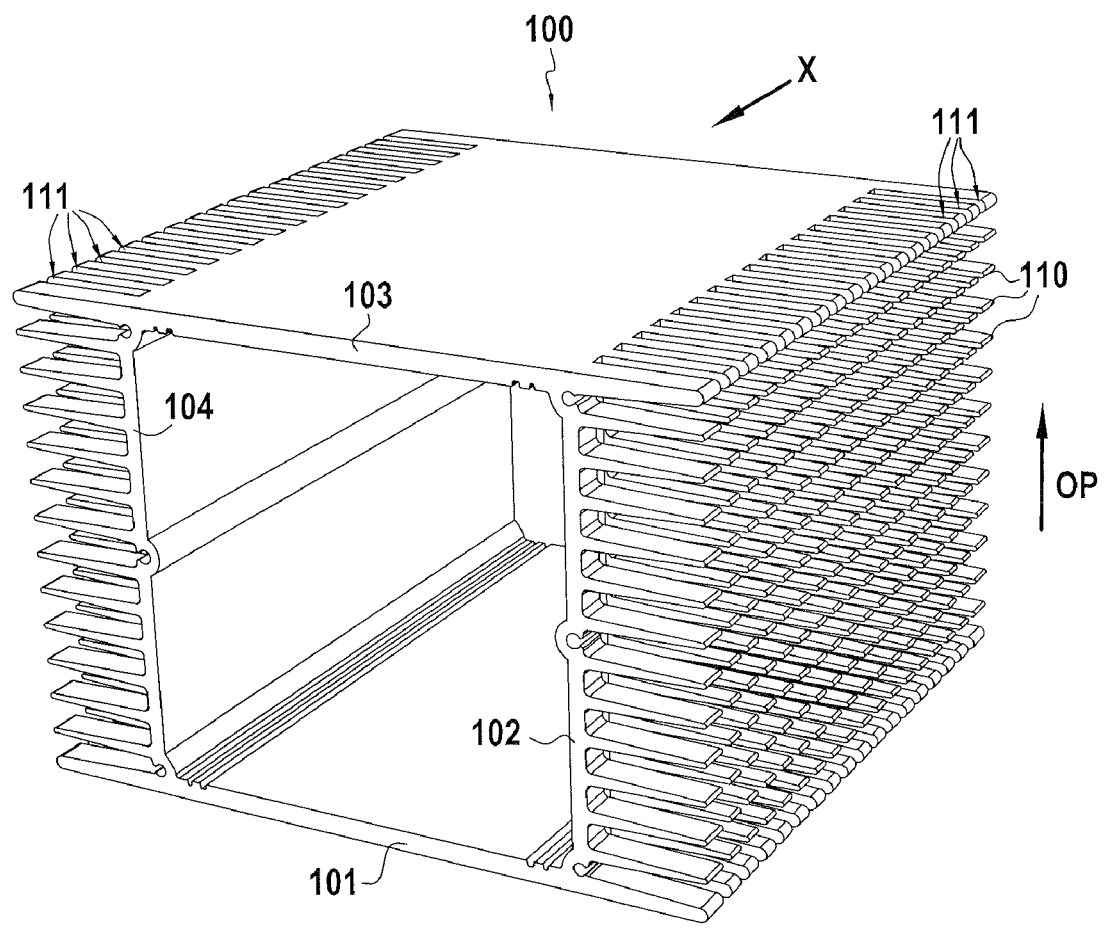
FIG. 1 is a perspective view of a preferred embodiment of a housing of the invention.

FIG. 1 shows a preferred embodiment of a housing 100 of the invention. The housing 100, which has a first sidewall, a second sidewall, a third sidewall that opposes the first side wall and a fourth sidewall that opposes the second sidewall, is a section member extruded into a tunnel in the direction X.

Figure 2A:
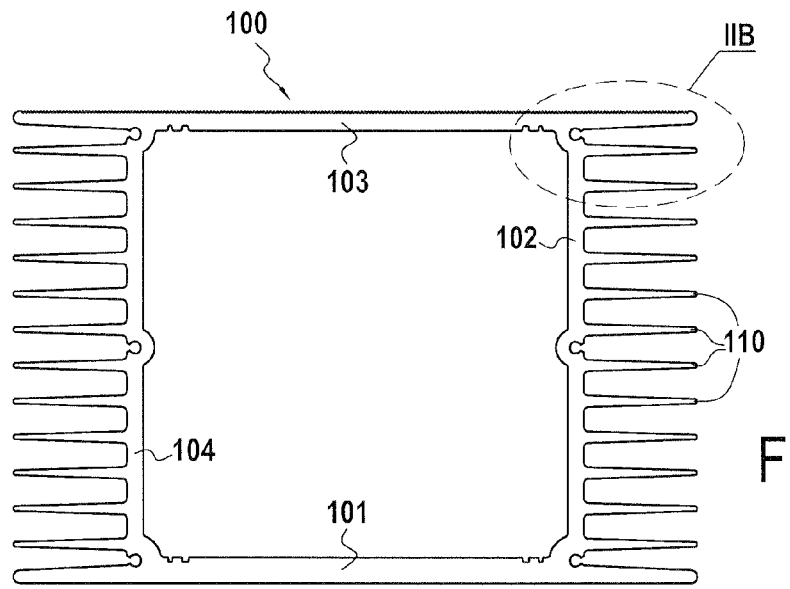
FIGS. 2A, 2B, and 2C are respectively a front view, a detail view, and a view from below of the housing shown in FIG. 1.

Thus, as shown in FIG. 2A, the extrusion profile is substantially rectangular (it is square in this example), and it is such that the housing 100 carries fins 110 laterally on the second sidewall 102 and the fourth 104 of the extruded rectangle. It can be seen clearly that the profile enables fins to be formed in the extrusion direction X only.

The extruded fins 110 extend in parallel manner between the first sidewall, or a base 101, that serves to fasten the housing and the fourth side 103 of the rectangle forming the tunnel by extrusion. This is the particular context within which the invention lies. As explained below, the fourth sidewall 101 preferably also serves as a support for supporting electronic elements of the power electronic device that is to be carried by the housing 100.

In accordance with the invention, the fins 110 are machined in such a manner as to present notches 111 aligned in succession with one another in an "optimum" direction OP. In this preferred embodiment of the invention, the optimum direction OP is perpendicular to the extrusion direction X which is also the direction of the fins 110. The preferred installation direction is then the horizontal direction.

When the optimum direction forms an angle different from 90° with the extrusion direction, the preferred installation direction is the direction for which, when the housing 100 is placed in said installation direction, the optimum direction is vertical.

Figure 2B:
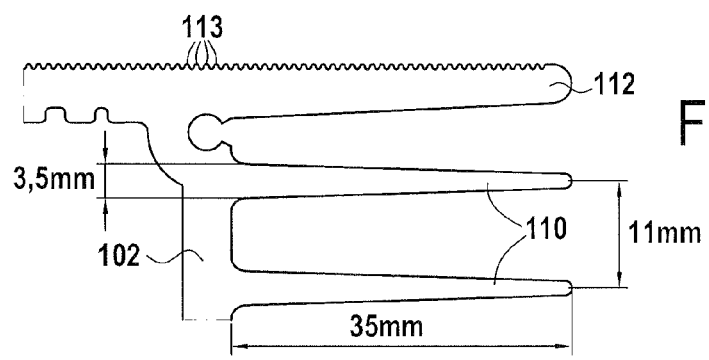
Figure 2C:
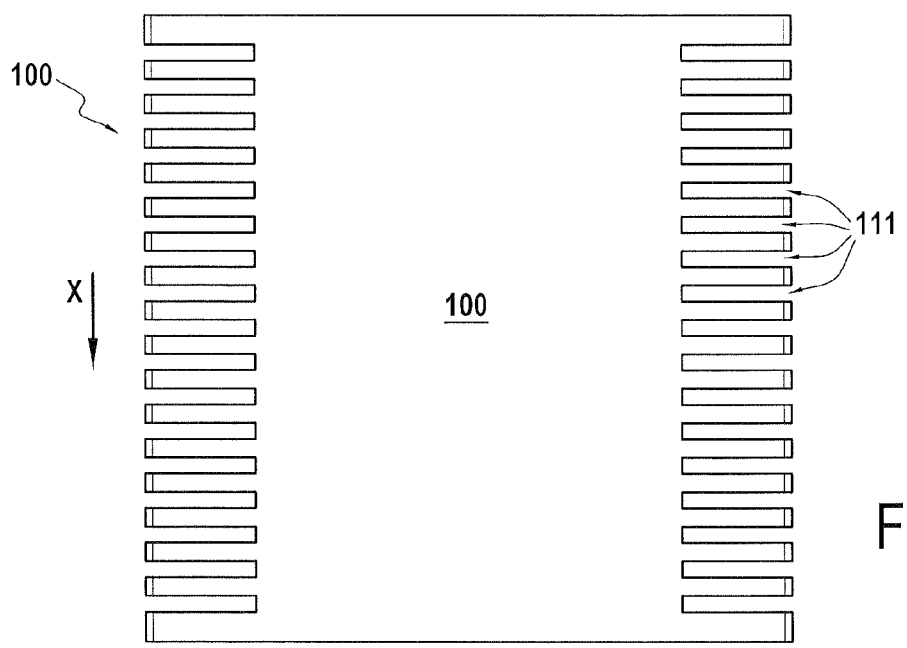

FIGS. 2A-2C show, more precisely, the details of how the housing 100 shown in FIG. 1 is formed. In this embodiment, the density of fins 110 and of metal corresponds to the needs of natural convection. FIG. 2B shows a detail of the profile of the extruded section member of the housing 100 as shown in FIG. 2A. This detail shows that the fins 110 are separated from one another by a distance of 11 mm and that they have a length of 35 mm outside the tunnel structure constituted by the sidewalls 101, 102, 103, and 104. In addition, it can be seen in FIG. 2B that the fins 110 have a thickness of 3.5 mm and are flanked by two thicker fins 112 extending respective ones of the sidewalls 101 and 103 of the extruded tunnel.

The spacing of the fins and their shape and dimensions are adapted to air flow by natural convection. As shown in FIGS. 2A-2C, the fins 110 are considered to be quite widely spaced apart from one another, corresponding to characteristics making it possible to procure good air flow by natural convection.

The fins are much closer together when they are on radiators operating with forced convection and therefore in combination with blown air.

Advantageously, on its face on the outside of the housing 100, the side 103 has a micro-striated surface with striations 113 whose characteristic radius is about a few tenths of a millimeter, and 0.25 mm in FIG. 2B.

FIG. 2C is a view from below of the housing 100. It can be observed that, in accordance with the invention, the fins 110 are machined in such a manner as to present notches 111.

In the preferred embodiment shown, the notches 111 are machined perpendicularly to the direction X. They are thus aligned with one another in the direction perpendicular to the direction X, i.e. in the viewing direction of FIG. 2C. The alignment of the notches 111 can also be seen in FIG. 1.

FIG. 3A shows an on-board charger 200 obtained by means of a housing 100 as shown in FIG. 1. Inside said housing, the quantity of heat that is generated by operation of the electronic components of the charger is such that it is absolutely necessary to remove heat in order to avoid damaging the electronic components.

Before the housing 100 is closed by two cheek plates 201 and 202, all of the electronic components that are necessary for operation of the on-board charger 200 are mounted inside said housing 100. At least one of the cheek plates (the cheek plate 202) carries a connection element 205 making it possible to connect the on-board battery charger 200 to power supply means (not shown). It should be noted that the use of a housing 100 that is extruded into a tunnel and then closed by two cheek plates 201 and 202 makes it easy to guarantee that the on-board charger 200 is waterproof, while also making said charger very easy to assemble.

Connection means 206 and 207 for connecting to a battery (not shown) are advantageously provided on each of the cheek plates 201 and 202 of the battery charger 200.

Advantageously, each of the cheek plates 201 and 202 has a portion designed to fasten the charger 200 to an element integral with the vehicle on board which the charger 200 is installed.

Fastening elements 203 and 204 are thus advantageously integral with the cheek plates 201 and 202. They are provided with orifices suitable for receiving fastener screws.

The fastener elements 203 and 204 advantageously have a slight offset relative to the plane level of the first sidewall 101 of the housing 100. This offset makes it possible to guarantee that the bottom of the housing 100 is properly in contact with the support to which the charger 200 is fastened. This enables the heat also to dissipate as much as possible by means of conduction between the first sidewall 101 of the housing 100 and the support to which the charger 200 is fastened.

In this example, the optimum direction in which the fins are machined and in which the notches are aligned is the direction Z on the reference frame of FIG. 3A, in which the direction X is the extrusion direction. By means of the presence of the fins in which the notches are machined, the on-board charger 200 shown in FIG. 3A can be installed by fastening the fastener portions 203 and 204 to any plane support of the vehicle on board which said charger is installed. Preferably, the plane support is horizontal or vertical, but it can also lie at any angle in the range 0° to 90°.

Removing heat by means of the natural convection of air between the fins and through the notches makes it possible to dissipate heat satisfactorily for numerous angular positions in which the on-board charger 200 is installed. However, heat removal is optimum for an installation direction such that either the fins are vertical or the optimum direction is vertical.

It is observed that by adding transversely machined fins on the third sidewall of the housing, i.e. on the sidewall opposite from the first sidewall 101, it becomes also possible to install the housing on a vertical support, the extrusion direction being horizontal or forming a non-zero angle with the vertical. With a third sidewall provided with perpendicularly machined fins, the housing can, in practice, be installed in any angular position.

When the housing is in the vertical position, it might be assumed that the housing of the invention presents energy dissipation that is lower than with a housing in which no notch is machined in the fins 110.

Whereas actually, with the invention, which aims to use natural convection only, energy dissipation is still better with notches 111 than without notches 111, including in the position in which the fins 110 are vertical. In natural convection, the presence of turbulence makes it possible to obtain energy dissipation efficiency that is better in the vertical position, even though metal has been removed.

As shown in FIG. 3A, the housing is advantageously anodized in such a manner as to present a black surface that therefore radiates to a greater extent than does a non-anodized surface.

Advantageously, the charger 200 further presents an internal structure making it possible to achieve a further improvement in heat dissipation by means of the fins.

Figure 4A:
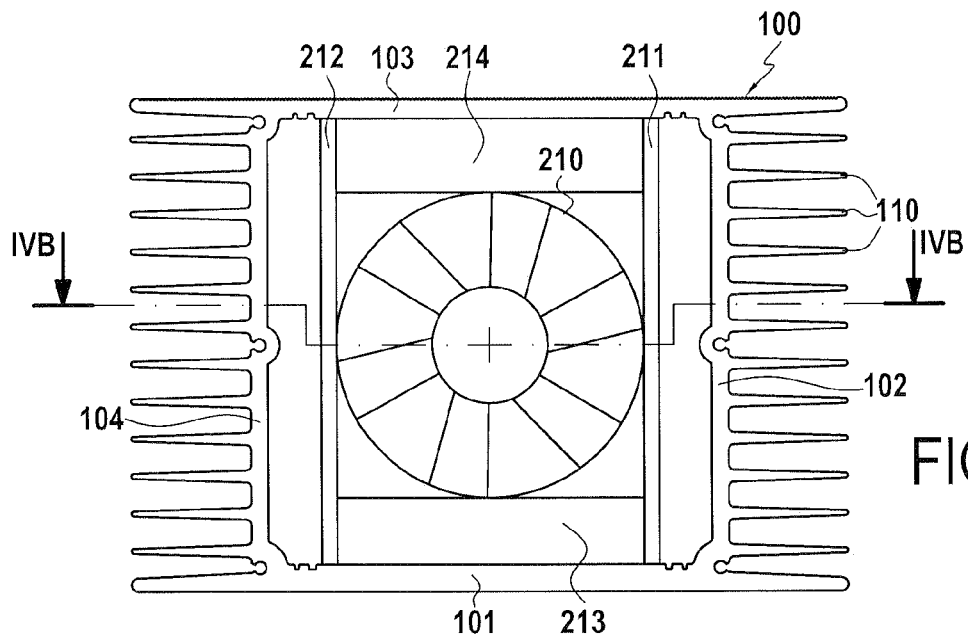
FIGS. 4A and 4B show a preferred embodiment of a power electronic device of the invention.
Figure 4B:
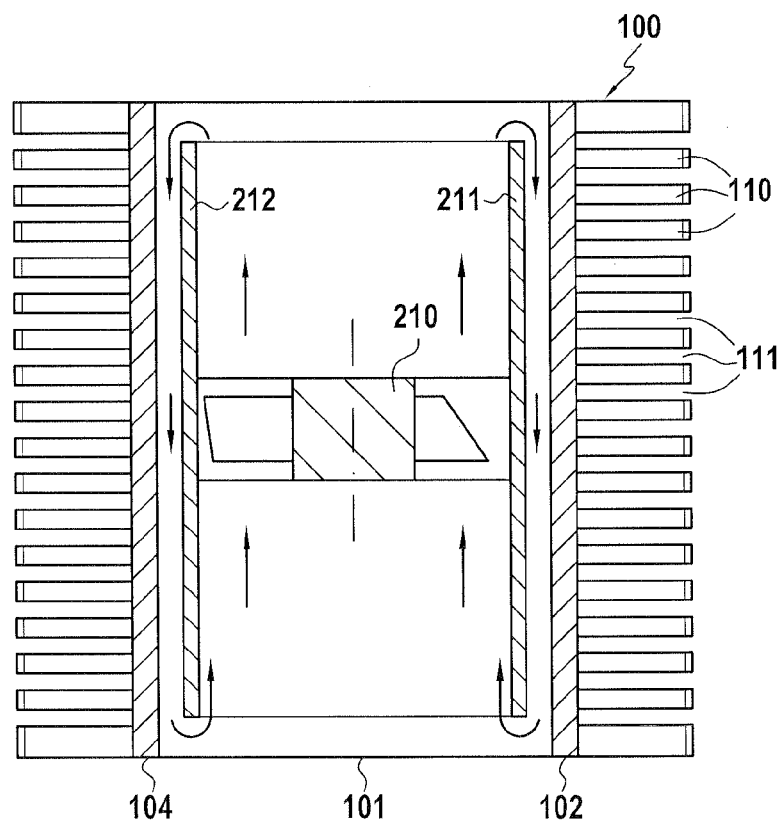

FIGS. 4A and 4B are diagrammatic section views, seen looking respectively from the front and from above, showing a particular embodiment of the charger 200 shown in FIG. 3.

In this embodiment, the electronic elements necessary for charger to operate are carried by two electronic cards 211 and 212. Between the two cards 211 and 212, a fan 210 is placed that is suitable for causing the air inside the housing 100 to flow in the manner represented by arrows in FIG. 4B.

In order to enable the air that is blown in this way to flow properly between the cards 211 and 212 and the second sidewall 102 and the fourth sidewall 104, partitions 213 and 214, shown in FIG. 4A, close the spaces between the housing 100, the fan 210 and the two cards 211 and 212, at the top of and at the bottom of the fan 210. The flow of the air is thus forced.

This embodiment is presented for a charger having two electronic cards placed laterally in the housing 100. However, other embodiments of a charger or of a power electronic device are quite possible with the housing 100 of the invention. In particular, such other embodiments include an embodiment in which a card carrying the power electronic components is placed in contact with or in the vicinity of the base 101 of the housing 100, which base serves to collect heat and to conduct heat towards the second sidewall 102 and the fourth sidewall 104 carrying the fins 110.

Figure 5A:
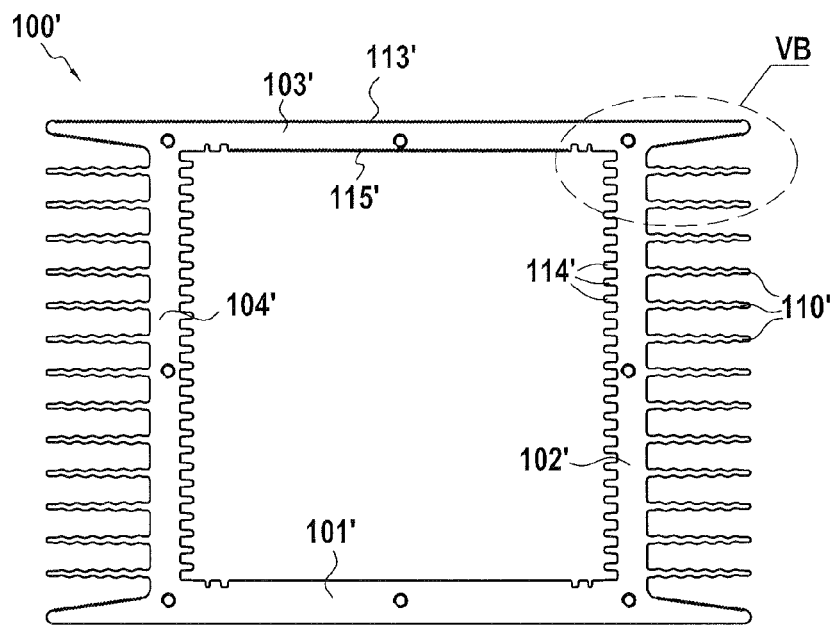
FIGS. 5A and 5B are respectively a front view and a detail view of a particular embodiment of the invention.
Figure 5B:
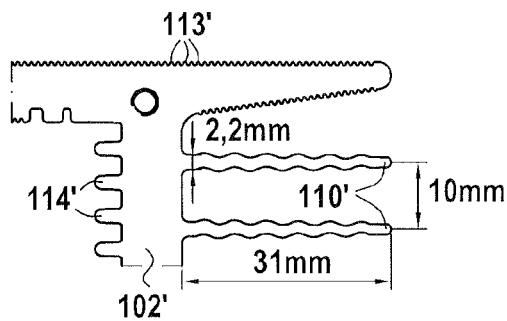

FIGS. 5A and 5B shows certain additional characteristics for the housing 100' of the invention. In FIGS. 5A and 5B, the extrusion profile presents a profile of undulating fins 110'. This undulation makes it possible to increase the surface area for exchange between the fins 110' and the air flowing between the fins 110'.

In FIG. 5B, it can also be seen that the thickness of the fins 110' is smaller than the thickness of the fins 110 shown in the FIG. 1 embodiment. These fins 110' have a width of 2.2 mm and are separated by 10 mm. Since the housings of the invention operate with natural convection, each fin does not have a very large thermal load to convey. Thus, the fins 110' are advantageously high and narrow.

In this example too, these characteristics make it possible to adapt the housing 100' to the specific conditions of natural convection, in which the easier it is for air to flow between the fins 110' and the more the exchange area is increased, the better heat is removed. The fact that the fins 110' are less thick makes it possible to increase the air flow space, which is a major parameter in natural convection.

The extrusion profile shown in FIG. 5A also has small fins internal to the housing 100', which fins are separated from one another by a distance of 5 mm and have a thickness of 2.2 mm.

These fins makes it possible to increase the exchange area inside the housing 100' and thus to facilitate conduction of heat towards the outside of the housing 100'.

It can also be seen that this housing 100' is provided with micro-striations 115' on the inside of the third sidewall 103' in addition to micro-striations 113' on the outside of the housing 100'. This characteristic aims to procure a further increase in the area of exchange between the housing 100' and the internal or the external air.

Finally, the first sidewall 101' is thicker than the first sidewall 101 of the housing 100 of FIG. 2 so as to conduct heat towards the second sidewall 102' and the fourth sidewall 104' carrying the fins 110'. This characteristic is particularly advantageous when an electronic card carrying power electronic components is placed in the vicinity of or in contact with the first sidewall 101' and removes heat by conduction through the housing 100' via this placement in contact with or in the vicinity of said first sidewall 101'.

In addition, the use of the first sidewall 101' for placing the electronic components and optionally for placing a card supporting them is very advantageous in practice, because it avoids problems of fastening to the lateral sides on which the fins are placed. It is difficult to place screws or fastener elements in amongst the fins because the fins take up a non-negligible amount of space and hinder putting screws in place and tightening them.

Furthermore, when the electronic elements or an electronic card are/is fastened to the first sidewall 101' and when screws therefore pass through the first sidewall 101', subsequently fastening the charger 200 to the plane support makes it possible to guarantee good waterproofing at the first sidewall 101 even if the first sidewall 101 is provided with holes for allowing the screws to pass through it.

Figure 6A:
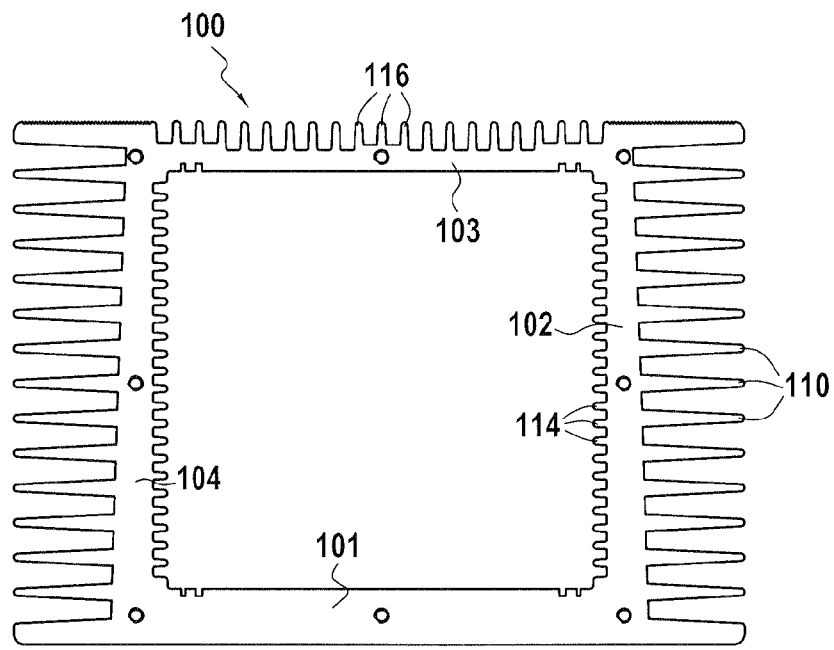
FIGS. 6A and 6B show various particular characteristics of the invention.
Figure 6B:
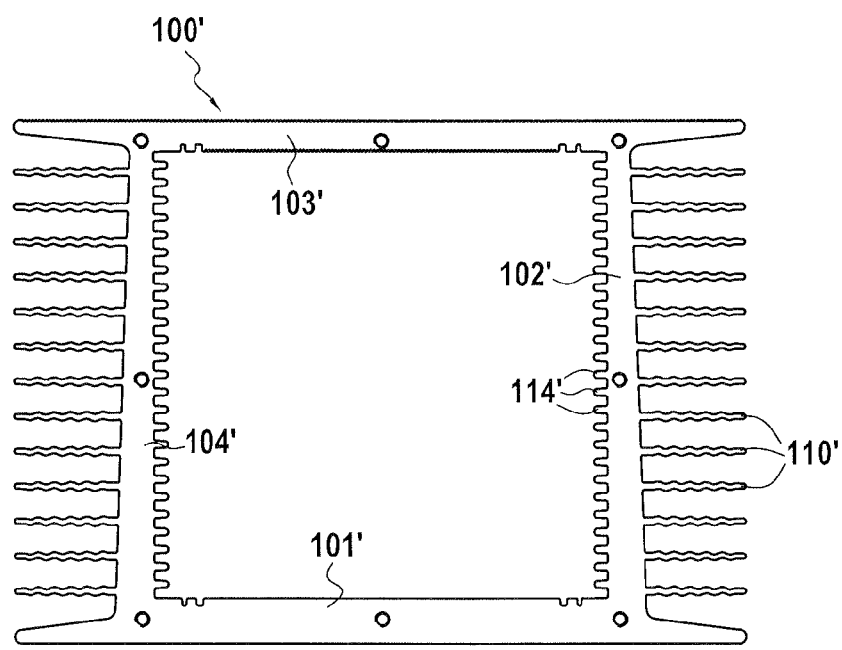

FIGS. 6A and 6B show two embodiments that are based on the embodiments of FIGS. 1 and 5. The characteristics of these embodiments procure an overall improvement in the energy dissipation efficiency of the housing 100 or 100'.

In FIGS. 6A and 6B, the second sidewall 102 or 102' and the fourth sidewall 104 or 104' present a thickness that tapers going from the first sidewall 101 or 101' to the third sidewall, or top of the housing, 103 or 103'. This characteristic is thus particularly advantageous when the first sidewall 101 serves as a support for an electronic card containing power electronic components.

Tapering the thickness of the second sidewall 102 or 102' and the fourth sidewall 104 or 104' serves to optimize energy dissipation while not compromising the ease of handling of the charger, i.e. while not increasing the total weight of the housing 100 or 100' to a dissuasive extent.

With the second sidewall 102 or 102' and the fourth sidewall 104 or 104' having such profiles, the fins 110 or 110' that are lowest, and thus that are closest to the first sidewall 101 or 101' are allowed to remove more heat than the fins 110 or 110' that are highest, i.e. than the fins close to the third sidewall 103 or 103'.

More precisely, it is observed that the temperature difference between the top and the bottom of a housing 100 or 100' is smaller in the embodiments of FIGS. 6A or 6B than in a housing 100 or 100' in the embodiments of FIG. 2 or 5 that has constant thickness for the second sidewall 102 or 102' and the fourth sidewall 104 and 104'.

Since dissipation is proportional to the difference between the temperature of the outside air and the temperature of the housing, the energy dissipation is thus better distributed when the extruded profile has the characteristics of FIG. 6.

The closer a point is to the third sidewall 103, the less it is necessary for thermal resistance at that point to be low.

Therefore, the further a point is away from the first sidewall 101, the less it is necessary for heat to be transferred at that point, and thus the less it is necessary for major conduction to be possible and the less thick the second sidewall 102 or the fourth sidewall 104 needs to be at the point.

In the embodiments proposed in FIGS. 6A and 6B, heat removal is further improved by means of the presence of small fins 114 or 114'.

In addition, in FIG. 6A, the top or third sidewall 103 is advantageously provided with small fins 116 of different heights. This characteristic is an additional improvement procured by the invention, making it possible to increase the removal of heat also via the top face 103 of the housing 100. Such an extruded profile carrying fins on the third sidewall 103 is advantageous in certain applications. The small fins 116 can optionally also be machined in a manner similar to the fins 110 and thus be provided with notches.

Thus, it is possible to imagine providing the third sidewall 103 of the extrusion profile of the housing 100 with fins 116 that are longer, e.g. that are of the same length as the fins 110, so as to provide the housing with a third face having fins, be they machined or not machined.

All of the embodiments shown are such that the notches are formed perpendicularly to the extrusion direction. This characteristic makes it possible to offer very good compatibility with all of the possible installation positions of the power electronic device manufactured with this embodiment of the housing of the invention.

Figure 7:
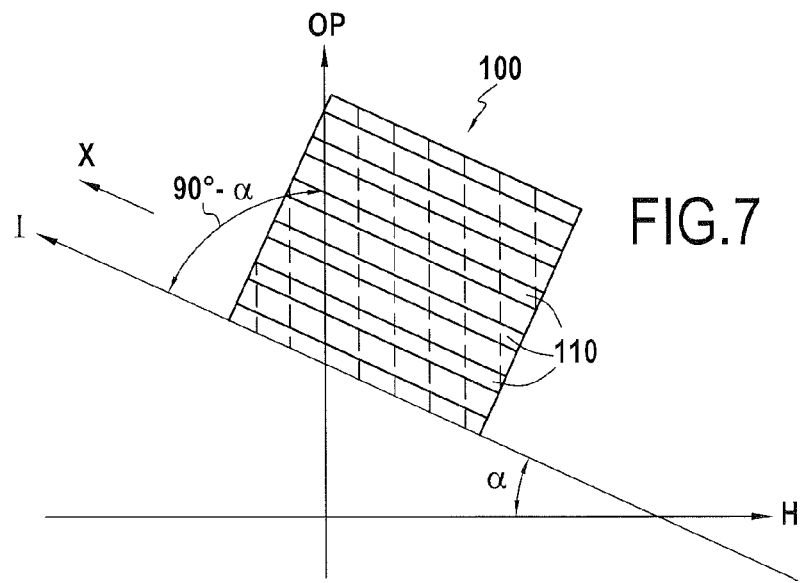
FIG. 7 shows the principles of the invention diagrammatically.

However, as defined in accordance with the principles of the invention, for applications in which the housing is to be installed on supports that form angles with the horizontal that lie in a certain range that is known in advance, the optimum direction for machining the notches advantageously forms an angle of 90° minus the mean angle of said range relative to the extrusion direction, this characteristic being shown in FIG. 7.

In FIG. 7, which summarizes the principles of the invention, the installation direction I of the housing 100, which coincides with the extrusion direction X, forms an angle α with the horizontal H. In accordance with the invention, the optimum direction OP then forms an angle 90°-α the extrusion direction X. The notches (not shown but whose alignments are represented diagrammatically by dashed lines in FIG. 7) are then machined so as to be aligned along the optimum direction OP. They are then aligned in the vertical direction when the housing 100 is installed along the installation direction I.

This makes it possible to guarantee that, in accordance with the invention, the notches are aligned with another along a median direction which is substantially placed vertically when the power electronic device is placed on its plane support.

Finally, it should be noted that various implementations can be achieved using the principles of the invention. In particular, in addition to the characteristics and embodiments presented above, the housing of the invention can be provided with asymmetrical fins. Such an implementation is advantageous when an electronic card is placed in the vicinity of a single one of the two sidewalls 102 or 104 of the housing of the invention, the longer fins being on the same side as the side on which said card is placed.

What is claimed is:

1. A housing for a multi-position waterproof power electronic device, comprising:
 a one piece aluminum alloy, extruded, substantially rectangular, sleeve having four sidewalls, including a first side wall, a second side wall, a third sidewall which opposes the first sidewall, and a fourth sidewall which opposes the second sidewall;
 fins on at least one of the four sidewalls, said fins on an outside of the at least one of the four sidewalls to allow air to flow outside of the housing by natural convection in an extrusion direction, the fins being part of the one piece, aluminum alloy, extruded, substantially rectangular sleeve, the fins being oriented in the extruded direction;
 one of the sidewalls having no fins and serving as a base for fastening the housing to power electric components of the power electric device and as support for the power electronic components of the power electronic device;
 rows of notches in the fins, wherein the fins are machined transversely to the extrusion direction so as to form the rows of notches in the fins,
 the rows of notches being aligned continuously in succession along an entire length of the extrusion direction, the rows of notches having a direction that forms an angle with the extrusion direction, each row of the rows of notches extending through all the fins, and
 each row of the rows of notches being of geometrical shape such that each row of the rows of notches allow air to flow outside of the housing by natural convection in an optimum direction.

2. The housing according to claim 1, wherein at least two of the four sidewalls of the sleeve which oppose each other have fins, outside of the sidewalls that are machined transversely so as to form the rows of notches that are identical on both of the sidewalls which are provided with the fins.

3. The housing according to claim 1, wherein at least two of the four sidewalls of the sleeve which oppose each other have fins, outside the sidewall that are machined transversely so as to form the rows of notches.

4. The housing according to claim 1, wherein the direction of the rows of notches forms an angle in the range of between 45° and 90° with the extrusion direction.

5. The housing according to claim 1, wherein the rows of notches are aligned in a direction that is perpendicular to the extrusion direction.

6. The housing according to claim 1, wherein the rows of notches are formed at regular intervals in the range of between 4 mm and 10 mm.

7. The housing according to claim 1, wherein the rows of notches present identical widths in the range of between 4 mm and 10 mm.

8. The housing according to claim 1, wherein distances between the rows of notches are substantially equal to widths of each row of the rows of notches.

9. The housing according to claim 1, wherein the fins are spaced apart by a distance in the range of between 6 mm and 16 mm.

10. The housing according to claim 1, wherein the fins have a thickness that tapers going outward from the sidewall.

11. The housing according to claim 1, wherein an inside face of at least one of the four sidewalls of the sleeve has micro-striations or micro-fins.

12. The housing according to claim 1, wherein the housing is treated by anodization.

13. A multi-position power electronic device, comprising:
 at least one electronic module for performing functions of a power electronic module mounted on at least one electronic card placed inside a housing according to claim 1, said housing being closed in a waterproof manner by two side cheek plates fastened hermetically to the housing.

14. The multi-position power electronic device according to claim 13, wherein, the device is a battery charger, and at least one electronic module is suitable for implementing battery charging functions.

15. The multi-position power electronic device according to claim 14, further comprising an internal air flow system.

16. The multi-position power electronic device according to claim 14, wherein the electronic card is carried by a metal support which is put into contact with at least one of the four sidewalls of the housing.

17. The housing according to claim 1, wherein the fourth sidewall is the base and has a thickness that is greater than a thickness of the second sidewall.

* * * * *